US008158268B2

(12) United States Patent
Kaneshiro et al.

(10) Patent No.: US 8,158,268 B2
(45) Date of Patent: *Apr. 17, 2012

(54) METAL-COATED POLYIMIDE FILM

(75) Inventors: Hisayasu Kaneshiro, Uji (JP); Takashi Kikuchi, Otsu (JP); Shogo Fujimoto, Otsu (JP)

(73) Assignee: Kaneka Corporation, Osaka (JP)

( * ) Notice: Subject to any disclaimer, the term of this patent is extended or adjusted under 35 U.S.C. 154(b) by 1032 days.

This patent is subject to a terminal disclaimer.

(21) Appl. No.: 12/012,275

(22) Filed: Feb. 1, 2008

(65) Prior Publication Data

US 2008/0182112 A1 Jul. 31, 2008

Related U.S. Application Data

(63) Continuation-in-part of application No. PCT/JP2006/315403, filed on Aug. 3, 2006, now abandoned.

(30) Foreign Application Priority Data

Aug. 4, 2005 (JP) ................................. 2005-226241

(51) Int. Cl.
*B32B 15/08* (2006.01)
(52) U.S. Cl. ............... 428/458; 428/473.5; 525/432; 525/436; 528/338; 528/340; 528/342; 528/347; 528/350; 528/353
(58) Field of Classification Search .............. 428/458, 428/473.5; 525/432, 436; 528/338, 340, 528/342, 347, 348, 350, 353
See application file for complete search history.

(56) References Cited

U.S. PATENT DOCUMENTS

| | | | |
|---|---|---|---|
| 5,412,066 A | 5/1995 | Hergenrother et al. | |
| 5,502,143 A * | 3/1996 | Oie et al. ..................... | 528/12 |
| 5,906,886 A * | 5/1999 | Yamaguchi ................... | 428/215 |
| 5,908,334 A | 6/1999 | Chen et al. | |
| 5,990,553 A | 11/1999 | Morita et al. | |
| 6,350,844 B1 | 2/2002 | Ono et al. | |
| 2003/0113521 A1 | 6/2003 | Nishinaka et al. | |
| 2004/0097694 A1 | 5/2004 | Fujihara et al. | |
| 2005/0221080 A1 | 10/2005 | Nishinaka et al. | |
| 2006/0048963 A1 | 3/2006 | Nishinaka et al. | |

FOREIGN PATENT DOCUMENTS

| | | |
|---|---|---|
| JP | 04-161437 | 6/1992 |
| JP | 04/207094 | 7/1992 |
| JP | 05-105850 | 4/1993 |
| JP | 05-222219 | 8/1993 |
| JP | 06-032926 | 2/1994 |
| JP | 6-264267 | 9/1994 |
| JP | 11-054862 | 2/1999 |
| JP | 11054862 | 2/1999 |
| JP | 11-071457 | 3/1999 |
| JP | 11-158276 | 6/1999 |
| JP | 2000-080178 | 3/2000 |
| JP | 2000-119521 | 4/2000 |
| JP | 2000119521 | 4/2000 |
| JP | 2001-040108 | 2/2001 |
| JP | 2001-072781 | 3/2001 |
| JP | 2001072781 | 3/2001 |
| JP | 2001262338 | 9/2001 |
| JP | 2004-137486 | 5/2004 |
| JP | 2004137486 | 5/2004 |
| WO | 02/34509 | 5/2002 |
| WO | WO 2004/050352 | 6/2004 |

OTHER PUBLICATIONS

Patent Abstracts of Japan, Publication No. 11-054862, Feb. 26, 1999, (1 pg).
Patent Abstracts of Japan, Publication No. 2000-080178, Mar. 21, 2000, (1 pg).
Patent Abstracts of Japan, Publication No. 2000-119521, Apr. 25, 2000, (1 pg).
Patent Abstracts of Japan, Publication No. 2001-072781, Mar. 21, 2001 (1 pg).
Patent Abstracts of Japan, Publication No. 2004-137486, May 13, 2004 (1 pg).
Patent Abstracts of Japan, Publication No. 06-264267, Sep. 29, 1994 (1 pg).
English translation of PCT International Preliminary Report on Patentability issued Feb. 5, 2008 (5 pgs).
English Translation of PCT International Preliminary Report on Patentability, PCT/JP2005/013738, Jul. 2005, 4 pgs.
Written Opinion, PCT/JP2005/013738, Oct. 2005, 3 pgs.
Patent Abstracts of Japan, Publication No. JP 05-222219, Aug. 1993, 1 pg.
Patent Abstracts of Japan, Publication No. JP 06-032926, Feb. 1994, 1 pg.
Patent Abstracts of Japan, Publication No. JP 11-158276, Jun. 1999, 1 pg.
Patent Abstracts of Japan, Publication No. JP 11-071457, Mar. 1999, 1 pg.
Patent Abstracts of Japan, Publication No. JP 04-161437, Jun. 1992, 1 pg.
Patent Abstracts of Japan, Publication No. JP 05-105850, Apr. 1993, 1 pg.

(Continued)

*Primary Examiner* — Callie Shosho
*Assistant Examiner* — John Freeman
(74) *Attorney, Agent, or Firm* — Kagan Binder, PLLC

(57) ABSTRACT

A metal-coated polyimide film is excellent in long-term adhesion reliability, exhibits various dimensional stabilities, and is particularly suitable for FPC, COF and TAB applications. The metal-coated polyimide film comprises a non-thermoplastic polyimide film; and a metal layer being directly formed on one surface or both surfaces of the non-thermoplastic polyimide film without using an adhesive, wherein the non-thermoplastic polyimide film contains a non-thermoplastic polyimide resin having a thermoplastic polyimide block component.

19 Claims, 1 Drawing Sheet

OTHER PUBLICATIONS

Patent Abstracts of Japan, Publication No. JP 2001-040108, Feb. 2001, 1 pg.

Amendment & RCE filed Apr. 19, 2010 & Advisory Action mailed Apr. 7, 2010, U.S. Appl. No. 11/698,656.

Amendment filed Mar. 26, 2010 & Advisory Action mailed Jan. 13, 2010, U.S. Appl. No. 11/698,656.

Amendment filed Jan. 8, 2010 & Office Action mailed Oct. 21, 2009, U.S. Appl. No. 11/698,656.

Amendment filed Jul. 2, 2009 & Office Action mailed Apr. 2, 2009, U.S. Appl. No. 11/698,656.

English-language translation of JP 04/207094, 15 pgs.

* cited by examiner

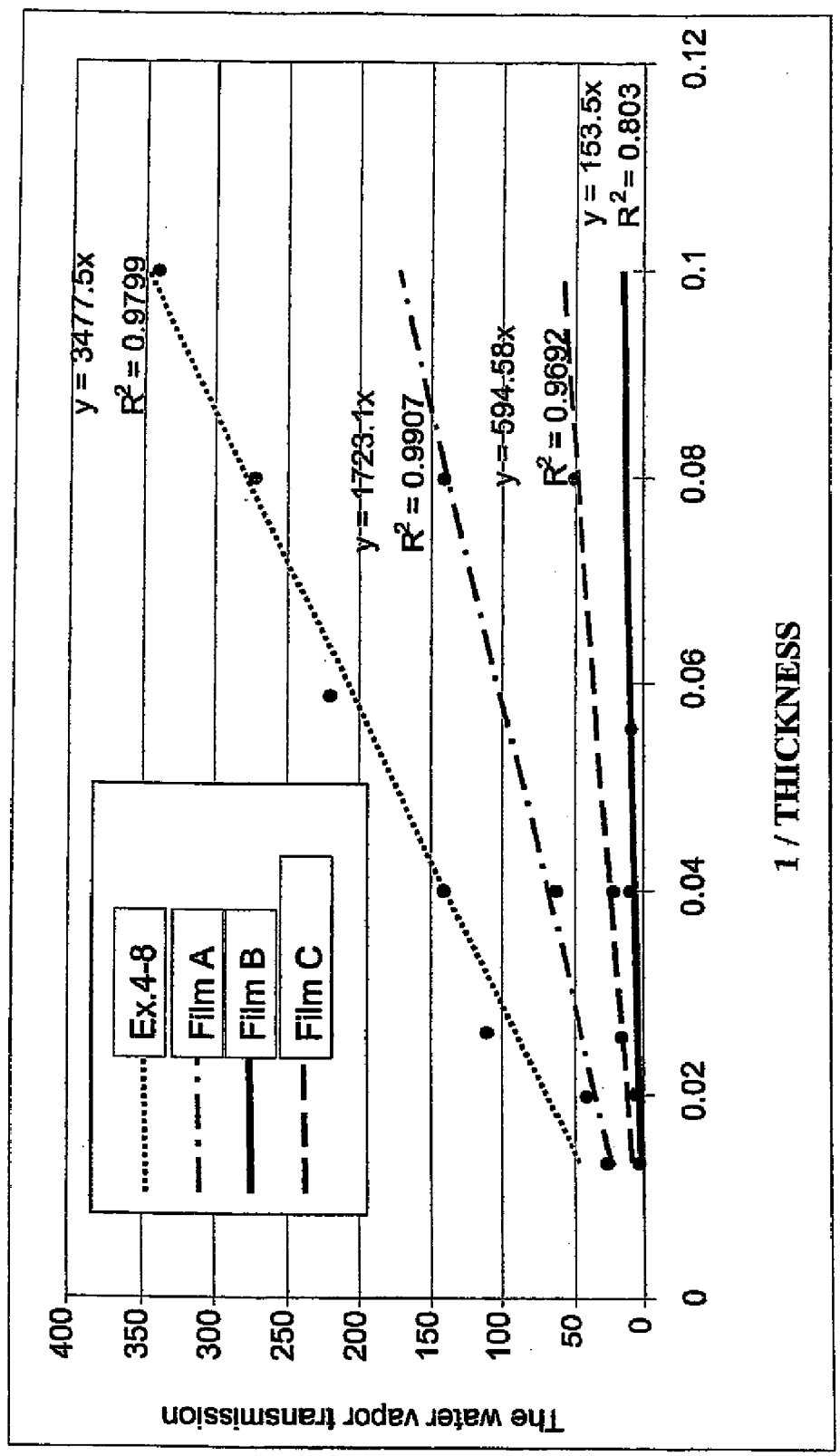

METAL-COATED POLYIMIDE FILM

PRIORITY

This is a continuation-in-part of International Application PCT/JP2006/315403, with an international filing date of Aug. 3, 2006, now abandoned, which in turn claims priority to Japanese Patent Application No. 2005-226241, filed Aug. 4, 2005, the contents of both which are incorporated herein by reference.

TECHNICAL FIELD

The present invention relates to a metal-coated polyimide film preferably used for electronic materials such as a flexible printed circuit ("FPC"), a flexible printed board, a flexible printed wiring board, a base film for Chip on Film ("COF"), and a tape-automated bonding ("TAB") tape.

BACKGROUND ART

Conventionally, polyimide resin having various superior properties, such as heat resistance and electrical isolation performance, has been widely used in the field of electronics. For example, films made from polyimide resin have been used for a flexible printed board, a TAB tape, and a base film for high-density storage medium. Polyimide resin has been used not only in the form of a film but also in various forms including a sheet and a coating agent. In a case where polyimide resin is used in the form of a film, the film is not always used alone. The film has been widely used in a laminated structure, like a structure in which a copper foil is bonded to the surface of the film with an adhesive, a structure in which the surface of the film is subjected to copper sputtering or copper electroplating, and a structure in which polyimide resin is cast or coated on a copper foil.

With the recent advance of technology of electronic materials and devices, a polyimide film used has been required to have more complex and much more properties other than basic properties such as heat resistance, isolation performance, and solvent resistance. For example, with the downsizing of electrical and electronic devices, flexible printed boards used in the devices are required to have fine wiring patterns. This requires polyimide films that exhibit smaller changes in dimension caused by heating and tension. The lower the linear expansion coefficient is, the smaller the amount of change in dimension caused by heating is. Moreover, the higher the elasticity modulus is, the smaller the amount of change in dimension caused by tension is. However, the polyimide films with high elasticity modulus and low linear expansion coefficient are generally produced using rigid monomers with high linearity, including pyromellitic dianhydride and p-phenylene diamine, for example. This gives rise to the following at least two problems: One problem is that the resulting films are inferior in flexibility and also inferior in bending properties which are required for flexible printed boards. The second problem is that inappropriate use of the monomers produces films having high water absorbency and high moisture expansion coefficient.

For example, in a case where the polyimide film is used for a semiconductor package, the polyimide film is required to have dimensional stability against heat and tension and dimensional stability under the conditions where moisture is absorbed. Therefore, a polyimide film having low linear expansion coefficient, high elasticity modulus, and low moisture expansion coefficient is desirable.

Furthermore, a finer wiring pattern has been formed on a polyimide film for use in a flexible printed board. As a result of this, the demand for metal-laminated polyimide film in which a thin-film metal that allows for the formation of a fine pattern is laminated has been increasing. This demand cannot be met by the method conventionally used in most cases. That is, the method in which a thin copper foil is laminated on the surface of polyimide film with the use of an adhesive such as a thermoplastic polyimide adhesive or epoxy adhesive makes it difficult to laminate a thin copper film suitable for a fine pattern thereon.

In view of this, as a method for producing a metal-laminated board without using an adhesive, a method of directly forming a metal without using an adhesive has been adopted in most cases, like a method in which a thin metal film is formed on the surface of polyimide film by using a sputtering apparatus or a metal vapor deposition apparatus, and then copper is laminated on the metal film by plating. The adoption of this method makes it possible to change a thickness of the metal layer to a thickness in the range from not less than 1 μm to several tens of micrometers as appropriate. In particular, since this technique allows for the formation of a thin film, it also has the feature that a metal layer having a thickness suitable for a fine pattern can be formed.

However, the above method has the following problem: Adherability between the film and the metal layer in the laminated board is lower than adherability obtained by a method using an adhesive, and the adherability obtained by the above method tends to decrease especially when an environmental resistance test is conducted. On this account, the improvement to a polyimide film has been required.

Patent Documents 1 and 2 disclose a polyimide film which is produced by using p-phenylenebis(trimellitic acid monoester anhydride) with the aim of decreasing water absorbency and moisture expansion coefficient. However, the polyimide film disclosed in Patent Documents 1 and 2 is instable in an environmental test, and reliability of the polyimide film decreases when the polyimide film is used for COF or the like.

Further, in the case of a method in which a metal layer is directly formed by sputtering, vapor deposition, or the like without using an adhesive, it is different in its production process from a method in which a metal foil is laminated with the use of an adhesive. For example, metal sputtering requires that a state within the system is changed to a nearly vacuum state in the process of sputtering. However, it is desired that a state within the system should be changed to a vacuum state as soon as possible in consideration of productivity.

Patent Document 3 discloses a polyimide film which is produced by using the following five components: p-phenylenebis(trimellitic acid monoester anhydride); pyromellitic dianhydride; biphenyltetracarboxylic dianhydride; p-phenylene diamine; and diaminodiphenylether. Patent Document 3 also discloses that adherability increases in a case where a metal layer is directly formed on the polyimide film by vapor deposition, sputtering, or the like without using an adhesive. However, the technical feature of Patent Document 3 is that types and compositions of monomers to be used are selected, and therefore totally different from that of the present invention.

Meanwhile, there is a known method in which polymerization is carried out at multiple stages to produce polyimide resin having a block component. For example, Patent Documents 4 and 5 disclose the following method as a method of polymerizing a block component in advance: a polyamic acid consisting of phenylenediamine and pyromellitic dianhydride or a polyamic acid consisting of phenylenediamine and 3,3'-, 4,4'-benzophenonetetracarboxylic acid is polymerized to form a block component of the polyamic acid, and imide is added to the obtained block component, whereby a copolymerized polyimide having a block component is produced. However, neither Patent Document 4 nor Patent Document 5 includes a step of forming a thermoplastic block component.

Thus, the technical idea has never been known of designing a film so that a thermoplastic polyimide block component is present in the film by using non-thermoplastic polyimide resin containing a thermoplastic polyimide block component, and the film is non-thermoplastic as a whole.

Patent Document 1: Japanese Unexamined Patent Application Publication No. 11-54862
Patent Document 2: Japanese Unexamined Patent Application Publication No. 2001-72781
Patent Document 3: Japanese Unexamined Patent Application Publication No. 2004-137486
Patent Document 4: Japanese Unexamined Patent Application Publication No. 2000-80178
Patent Document 5: Japanese Unexamined Patent Application Publication No. 2000-119521

DISCLOSURE OF INVENTION

[Problems to be Solved by the Invention]

The present invention has been attained to solve the above problems, and an object thereof is to provide a metal-coated polyimide film which is obtained by directly forming a metal layer on a polyimide film without the use of an adhesive, and which is excellent in adherability and various dimensional stabilities (dimensional stability against heat and tension and dimensional stability under the conditions where moisture is absorbed).

[Means for Solving the Problems]

To achieve this object, the present inventors have conducted extensive studies and found that a polyimide film containing a polyimide whose molecules are adequately designed exhibits high adherability even when a metal layer is directly formed on the polyimide film without using an adhesive. The present invention has been made based on this finding. In particular, the present invention can solve the above-described problem by providing a novel metal-coated polyimide film in accordance with any of the embodiments described below:

1) A metal-coated polyimide film comprising: a non-thermoplastic polyimide film; and a metal layer being directly formed on one surface or both surfaces of the non-thermoplastic polyimide film without using an adhesive, wherein the non-thermoplastic polyimide film contains a non-thermoplastic polyimide resin having a thermoplastic polyimide block component.

2) The metal-coated polyimide film described in 1), wherein the thermoplastic block component is present in an amount of 20 to 60 mol % of the entire non-thermoplastic polyimide resin.

3) The metal-coated polyimide film described in 1) or 2), wherein the diamine component in the thermoplastic polyimide block component contains 2,2-bis(4-aminophenoxyphenyl)propane.

4) The metal-coated polyimide film described in any of 1) through 3), wherein the acid component in the thermoplastic polyimide block component contains a benzophenonetetracarboxylic acid and/or a biphenyltetracarboxylic acid.

5) The metal-coated polyimide film described in any of 1) through 4), wherein the number n of repeating units of the thermoplastic polyimide block component is 3 to 99.

6) The metal-coated polyimide film described in 5), wherein the number n of repeating units of the thermoplastic polyimide block component is 4 to 90.

7) The metal-coated polyimide film described in any of 1) through 6), wherein the non-thermoplastic polyimide film is a polyimide film consisting of a non-thermoplastic polyimide resin having a thermoplastic polyimide block component.

8) The metal-coated polyimide film described in any of 1) through 6), wherein the non-thermoplastic polyimide film further contains a filler and a non-thermoplastic polyimide resin having a thermoplastic polyimide block component.

9) The metal-coated polyimide film described in 8), wherein the non-thermoplastic polyimide resin having the thermoplastic polyimide block component is 50 wt % or more of the polyimide film.

10) The metal-coated polyimide film described in 1), wherein the metal layer has a metal layer A formed by dry film forming method.

11) The metal-coated polyimide film described in 10), wherein the metal layer A has: a metal layer A1 that contacts the non-thermoplastic polyimide film; and a metal layer A2 formed on the metal layer A1.

12) The metal-coated polyimide film described in 10) or 11), wherein the dry film forming method is any method selected from sputtering, ion plating, and vapor deposition.

13) The metal-coated polyimide film described in 11), wherein the metal layer A1 contains at least one metal selected from the group consisting of Ni, Cu, Mo, Ta, Ti, V, Cr, Fe, and Co.

14) The metal-coated polyimide film described in any of 10) through 13), wherein a metal layer is formed on the metal layer A by electroless plating or electroplating.

15) The metal-coated polyimide film described in any of 10) through 13), further comprising: (i) a metal layer being formed on the metal layer A by electroless plating; and (ii) a metal layer being formed on the metal layer (i) by electroplating.

16) A metal-coated polyimide film comprising: a base metal layer being formed on one surface or both surfaces of a non-thermoplastic polyimide film containing non-thermoplastic polyimide resin having thermoplastic polyimide block component by dry film forming method; and a conductive layer being formed on the metal layer by at least one of sputtering, electroplating, and electroless plating.

16) A flexible printed wiring board including a metal-coated polyimide film according to any of 10 through 16.

17) A base polyimide film used in a method for producing a metal-coated polyimide film in which a metal layer is directly formed on a polyimide film without using an adhesive while vacuum suction is carried out with a vacuum pump, wherein the polyimide film contains a non-thermoplastic polyimide resin having a thermoplastic polyimide block component.

Additionally, a method is provided for preparing a metal-coated polyimide film comprising:

a) providing a non-thermoplastic polyimide film containing a non-thermoplastic polyimide resin having a thermoplastic polyimide block component;

b) applying vacuum suction to the polyimide film; and c) forming a metal layer directly on the polyimide film by a dry film forming method without using an adhesive.

An additional method of preparing a metal-coated polyimide film is provided, comprising:

a) providing a non-thermoplastic polyimide film having the value represented by following equation (3):

$$\text{a water vapor transmission rate} \times \text{thickness} \qquad (3)$$

of at least about 2500 µm·g/m²/24 h;
  b) applying vacuum suction to the polyimide film; and
  c) forming a metal layer directly on the polyimide film by a dry film forming method without using an adhesive.

In a preferred embodiment, the above method is carried out wherein the non-thermoplastic polyimide film has a value represented by following equation (3) of at least about 3000 µm·g/m²/24 h.

In certain method embodiments of the present invention, the dry film forming method is any method selected from sputtering, ion plating, and vapor deposition.

[Effects of the Invention]

According to the present invention, it is possible to provide a metal-coated polyimide film which is excellent in long-term adhesion reliability and various dimensional stabilities and suitable for wiring boards for high-density package, such as COF.

BRIEF DESCRIPTION OF THE DRAWING

FIG. 1 is a graph showing the relationship between water vapor transmission rate and thickness of material of sample of the present invention.

BEST MODE FOR CARRYING OUT THE INVENTION

The following will describe an embodiment of the present invention. A metal-coated polyimide film of the present invention is obtained by directly forming a metal layer, without using an adhesive, on a non-thermoplastic polyimide film that contains a non-thermoplastic polyimide resin having a thermoplastic polyimide block component.

The present inventors have studied various molecular designs for polyimide. A polyimide film of the present invention is a non-thermoplastic polyimide film, but contains a thermoplastic polyimide block component therein. More specifically, a polyimide film is obtained by designing a polyimide resin that constitutes the film so as to be a polyimide resin whose molecule contains a thermoplastic polyimide block component and which is non-thermoplastic as a whole. The present inventors have found that such a molecular design for the polyimide resin that constitutes a polyimide film gives some remarkable properties to a metal-coated film obtained by directly forming a metal layer on the polyimide film without using an adhesive.

That is, a metal-coated polyimide film of the present invention is such that a non-thermoplastic polyimide film as a base material has low linear expansion coefficient, low moisture expansion coefficient, and a moderate elasticity modulus, and the non-thermoplastic polyimide film has excellent dimensional stabilities against various external changes that are given to the metal-coated film. As a result of study made by the present inventors, it was found that the above-designed non-thermoplastic polyimide film has a high water vapor transmission rate. This means that the film humidifies and dehumidifies quickly. Therefore, it is possible to considerably enhance the productivity of a metal-coated polyimide film which is obtained by directly forming a metal layer by using a method that takes advantage of the above properties, for example, by sputtering onto the polyimide film while vacuum suction is carried out.

(Non-Thermoplastic Polyimide Film Used in the Present Invention)

The polyimide film of the present invention is produced by using polyamic acid as a precursor. The polyamic acid may be produced by any known method. Typically, substantially equimolar amounts of an aromatic acid dianhydride and aromatic diamine are dissolved in an organic solvent to prepare a polyamic acid organic solvent solution, and this solution is stirred under controlled temperature conditions until polymerization of the acid dianhydride and the diamine is completed. The polyamic acid solution is usually obtained at a concentration of 5 to 35 wt % and preferably 10 to 30 wt %. A solution having a concentration within this range has an adequate molecular weight and an adequate solution viscosity.

Various known processes and combinations of these processes may be employed as the polymerization process. The key feature of the polymerization process for producing polyamic acid is the order of adding the monomers. The physical properties of the resulting polyimide are adjusted by controlling the order of adding the monomers. Thus, in the present invention, any process of adding monomers may be employed for producing the polyamic acid. Representative examples of the polymerization processes are as follows:

1) A process including dissolving an aromatic diamine in an organic polar solvent and reacting the aromatic diamine with a substantially equimolar amount of an aromatic tetracarboxylic dianhydride to conduct polymerization;
2) A process including reacting an aromatic tetracarboxylic dianhydride and fewer moles of an aromatic diamine in an organic polar solvent to prepare a prepolymer having acid anhydride groups at the both ends and polymerizing at multiple stages the prepolymer with an aromatic diamine so that the aromatic tetracarboxylic dianhydride and the aromatic diamine both used in the entire process of polymerization are substantially equimolar;
3) A process including reacting an aromatic tetracarboxylic dianhydride and excess moles of an aromatic diamine in an organic polar solvent to prepare a prepolymer having amino groups at the both ends, adding an additional aromatic diamine to the prepolymer, and then polymerizing at multiple stages the resulting mixture with an aromatic tetracarboxylic dianhydride so that the aromatic tetracarboxylic dianhydride and the aromatic diamine both used in the entire process of polymerization are substantially equimolar;
4) A process including dissolving and/or dispersing an aromatic tetracarboxylic dianhydride in an organic polar solvent and polymerizing the aromatic tetracarboxylic dianhydride with a substantially equimolar amount of an aromatic diamine; and
5) A process including reacting a substantially equimolar mixture of an aromatic tetracarboxylic dianhydride and an aromatic diamine in an organic polar solvent to conduct polymerization.

Any one or combination of these processes may be employed.

The polyimide resin that constitutes the non-thermoplastic polyimide film of the present invention contains a thermoplastic polyimide block component in the molecule, but is designed so that the film functions as a non-thermoplastic polyimide film as a whole. Such a design concept of the polyimide film that is a base material of the metal-coated polyimide film is important in the present invention. The polyimide resin having a thermoplastic block component makes it possible to solve various problems associated with a metal-coated film wherein a metal layer is directly formed without using an adhesive. A preferable polymerization process for obtaining such a polyimide resin is a process including preparing a block component of the thermoplastic polyimide precursor (polyamic acid prepolymer that imparts thermoplastic polyimide) and subsequently preparing a precursor of the non-thermoplastic polyimide using the remaining diamine and/or acid dianhydride. This process is ideal for preparing the thermoplastic block component. Here, it is preferable to adopt any partial combination of two or more of the processes 1) to 5). Particularly, the processes 2) and 3) are preferable in that they ensure introduction of a thermoplastic polyimide block component.

For example, in the process 2) or 3) above, the prepolymer may be made by controlling the composition so that a thermoplastic polyimide is yielded by reacting equimolar amounts of the aromatic tetracarboxylic dianhydride and the aromatic diamine compound, and adequate aromatic tetracarboxylic dianhydride and aromatic diamine compound used in the entire process may be selected so that the final product, polyimide, exhibits non-thermoplastic properties.

For example, a polyamic acid solution may be obtained as follows: After dissolving 2,2-bis[4-(4-aminophenoxy)phenyl]propane (BAPP) in DMF, i.e., N,N-dimethylformamide, pyromellitic dianhydride (PMDA) and 3,3',4,4'-benzophenonetetracarboxylic dianhydride (BTDA) are added so that the total amount of anhydride is smaller relative to BAPP to prepare a thermoplastic polyimide block component (polyamic acid prepolymer that imparts thermoplastic polyimide). After that, p-phenylene diamine (p-PDA) is dissolved in the resulting prepolymer solution, and PMDA is added to the prepolymer solution so that the total of the acid dianhydride used in the entire process is substantially equimolar to the amount of diamine. Thereby, a polyamic acid solution is obtained.

Here, the "thermoplastic polyimide block component" refers to a component that gives a film that softens and does not retain its original shape after 1 minute of heating at 450° C. on a fixing frame. There are two types of evaluation of a polyimide block component depending on its purpose. One evaluation is for judgment of whether the polyimide block component is thermoplastic, and another is for further determination of how thermoplastic the polyimide block component is. For purposes of evaluation of whether a polyimide block component is thermoplastic, a block component film is prepared by reacting the amounts of dianhydride and diamine compounds that constitute the block component, and completing formation of the film by adding sufficient amount of additional dianhydride or additional diamine so that equimolar amounts of dianhydride and diamine are present in the composition, thereby forming a block component film (hereinafter, this film is referred to as "the polyimide film composed of the thermoplastic polyimide block component").

The sample that is representative of the block component for evaluation purposes can be prepared in two different ways. In a first evaluation sample preparation, the additional dianhydride or diamine used to complete the film formation of the block component is selected from the dianhydrides or diamines already used in the proposed thermoplastic polyimide block component. This first sample preparation advantageously provides an excellent model of the character of the block component. Where there is more than one dianhydride or diamine used in the proposed thermoplastic polyimide block component, the dianhydride or diamine used to complete the film formation is that which contributes the highest Tg to the polyimide film composed of the thermoplastic polyimide block component. Alternatively, if there are two or more types of diamine components that constitute the block component, the most rigid diamine component can be selected as the additional diamine component. In a second evaluation sample preparation, the additional dianhydride or diamine used to complete the film formation is selected from pyromellitic acid dianhydride (in the case of the compound having diamine functionality) or p-phenylenediamine (in the case of the compound having acid dianhydride functionality). This second sample preparation has the advantage of providing a standard test for ease of comparison of different proposed thermoplastic polyimide block components. Unless otherwise indicated, this second sample preparation is intended for use in evaluation of all proposed thermoplastic polyimide block components to determine if the block component is thermoplastic, and additionally for further determination of how thermoplastic the polyimide block component is.

For purposes of evaluation of how thermoplastic the polyimide block component is, the polyimide film composed of the thermoplastic polyimide block component should be prepared at a low baking temperature by a known method, for example, baking temperature of 300° C. and baking time of 15 minutes. If a polyimide block component film for evaluation can not be obtained due to melting at even such a low baking temperature, the block component used therein is deemed to have 300° C. or less thermoplastic characteristics. If a polyimide block component film for evaluation can be obtained, the obtained film is then to be heated up to melting. Thus the melting temperature of the film can be determined. It is preferable that the melting temperature determined by such a procedure is in a range of 250° C. to 450° C., preferably, in a range of 300° C. to 400° C.

When the melting temperature of the polyimide block component film is excessively low, it becomes difficult to produce an end product non-thermoplastic polyimide film. When the melting temperature of the polyimide block component film is excessively high, high adherability, which is the advantageous feature of the present invention, is rarely obtainable.

In producing a prepolymer in the above processes 2) and 3), an aromatic tetracarboxylic dianhydride component and an aromatic diamine component are used in such a manner that either of them is higher in molar quantity. A molar ratio of the aromatic tetracarboxylic dianhydride component to the aromatic diamine component, which is not particularly limited, is preferably 100:85 to 100:95, or 100:105 to 100:115.

The technical feature of the present invention is that a thermoplastic block component is ideally present in a non-thermoplastic polyimide resin. It is important that the block is thermoplastic as a whole, and a rigid component can be used as monomers that constitute a thermoplastic block component, as long as a thermoplastic block is formed with the use of such monomers.

The thermoplastic polyimide block component is preferably present in an amount of 20 to 60 mol %, more preferably 25 to 55 mol %, and most preferably 30 to 50 mol % of the entire polyimide.

When the content of the thermoplastic polyimide block component is below this range, high adherability may not be easily achieved, and when the content of the thermoplastic polyimide block component is above this range, it becomes difficult to obtain a non-thermoplastic polyimide film as an end product.

For example, when the polymerization process described in 2) is employed, the content of the thermoplastic polyimide block component is determined by the following equation (1):

$$\text{(Thermoplastic block component content)} = a/Q \times 100 \quad (1)$$

wherein a is the amount (mol) of the acid dianhydride component used in producing the thermoplastic polyimide block component, and Q is the total amount of the acid dianhydride component (mol).

When the polymerization process described in 3) is employed, the content of the thermoplastic polyimide block component is determined by the following equation (2):

(Thermoplastic block component content)=$b/P$×100 (2)

wherein b is the amount (mol) of the diamine component used in producing the thermoplastic polyimide block component, and P is the total amount (mol) of the diamine.

The number n of the repeating units of the thermoplastic block component is preferably 3 to 99 and more preferably 4 to 90. When n is below this range, high adherability is not easily obtained, and the moisture expansion coefficient tends to increase. When n is beyond this range, the storage stability of the polyimide precursor solution tends to decrease, and the reproducibility of polymerization tends to decrease.

The thermoplastic polyimide block component in the present invention is preferably one that gives a polyimide film having a glass transition temperature (Tg) in the range of 150° C. to 300° C. when the film is made by the above-described process. The glass transition temperature Tg can be determined based on the inflection point of the storage modulus determined with a dynamic viscoelasticity analyzer (DMA) or the like.

The monomers that form the thermoplastic polyimide block component of the present invention will now be described. A diamine component preferably used to provide a thermoplastic block component is a diamine having flexibility, which is a diamine including a flection structure, for example, an ether group, a sulfonic group, a ketone group, or a sulfide group. The diamine preferably used is represented by the following general Formula (1):

General Formula (1)

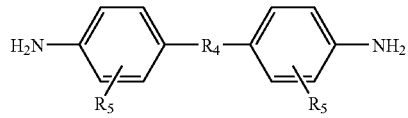

where $R_4$ is a group selected from a group including a bivalent organic group represented by General Formula Group (1):

General Formula Group (1)

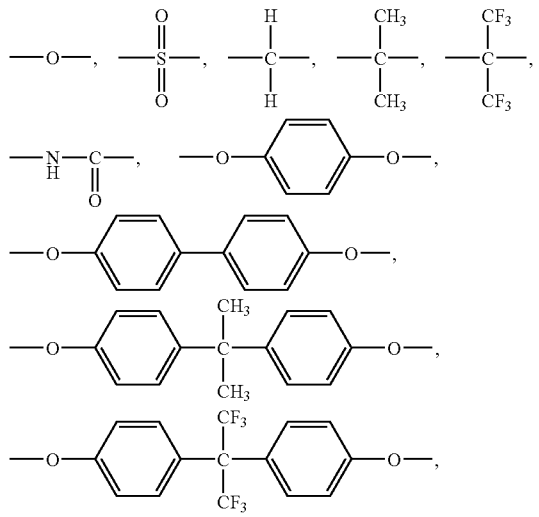

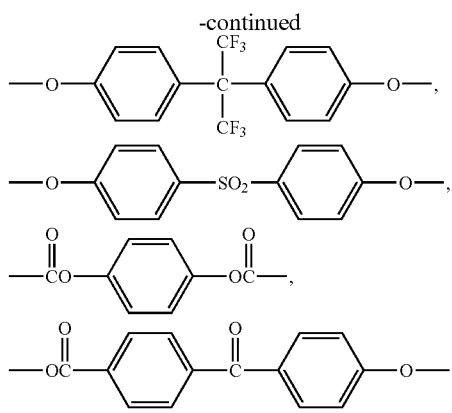

where $R_5$ is one, identically or independently, selected from the group consisting of H—, $CH_3$—, —OH, —$CF_3$, —$SO_4$, —COOH, —CO—$NH_2$, Cl—, Br—, F—, and $CH_3O$—.

Preferable examples of diamine include 4,4'-diaminodiphenylpropane, 4,4'-diaminodiphenylmethane, 4,4'-diaminodiphenyl sulfide, 3,3'-diaminodiphenylsulfone, 4,4'-diaminodiphenylsulfone, 4,4'-oxydianiline, 3,3'-oxydianiline, 3,4'-oxydianiline, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene(p-phenylenediamine), bis{4-(4-aminophenoxy)phenyl}sulfone, bis{4-(3-aminophenoxy)phenyl}sulfone, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,3-bis(4-aminophenoxy)benzene, 1,3-bis(3-aminophenoxy)benzene, 3,3'-diaminobenzophenone, 4,4'-diaminobenzophenone, and 2,2-bis(4-aminophenoxyphenyl)propane. These may be used alone or in combination. The examples provided above are for the main component.

Any type of diamine may be used as the auxiliary component. Among these compounds, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,3-bis(4-aminophenoxy)benzene, 1,3-bis(3-aminophenoxy)benzene, and 2,2-bis(4-aminophenoxyphenyl)propane are particularly preferable as the diamine.

Preferable examples of the acid component constituting the thermoplastic polyimide precursor block component include, pyromellitic dianhydride, 3,3',4,4'-benzophenonetetracarboxylic dianhydride, 3,3',4,4'-biphenyltetracarboxylic dianhydride, and 4,4'-oxydiphthalic dianhydride. These compounds may be used alone or in combination. In the present invention, it is preferable to use at least one acid dianhydride selected from the group consisting of 3,3',4,4'-benzophenonetetracarboxylic dianhydride, 3,3',4,4'-biphenyltetracarboxylic dianhydride, and 4,4'-oxydiphthalic dianhydride. By using these acid dianhydrides, high adherability to the metal layer, which is the advantage of the present invention, can be easily achieved.

Preferable examples of the diamine and the acid dianhydride (diamine and acid dianhydride that are reacted with a prepolymer in the above processes 2) and 3)) used in producing the non-thermoplastic polyimide precursor in combination with the thermoplastic polyimide precursor block component are now described. Since properties change with the combination of the diamine and the acid dianhydride, it is not feasible to establish a general limitation. However, the main component of the diamine is preferably a rigid component, such as p-phenylene diamine or its derivative or benzidine or its derivative. The diamine having the rigid structure can impart non-thermoplasticity and high elasticity modulus.

The diamine component used to impart non-thermoplasticity to the end product polyimide resin is preferably a diamine having a rigid structure. The diamine including the rigid structure in the present invention is represented by Formula (2):

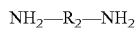
General Formula (2)

where $R_2$ is a group selected from an bivalent aromatic group represented by General Formula Group (2):

General Formula Group (2)

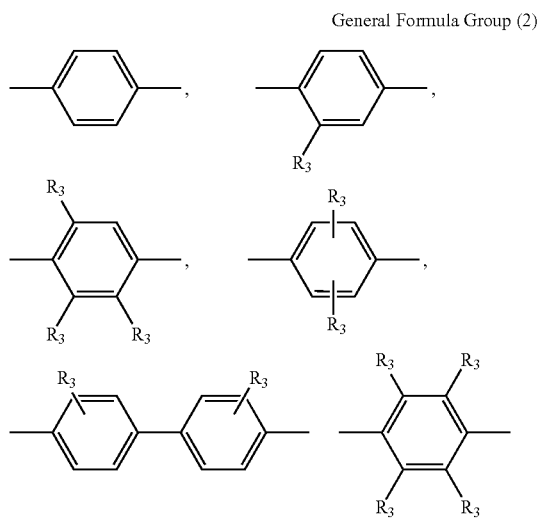

where $R_3$ is one, identically or independently, selected from the group consisting of H—, $CH_3$—, —OH, —$CF_3$, —$SO_4$, —COOH, —CO—$NH_2$, Cl—, Br—, F—, and $CH_3O$—.

The acid component preferably contains pyromellitic dianhydride as the main component. As is well known in the art, pyromellitic dianhydride easily gives a non-thermoplastic polyimide due to its rigid structure. In this manner, the molecular design is determined so that non-thermoplasticity is imparted to the end product polyimide film.

Whether the resulting polyimide film is thermoplastic or not is determined by the following procedure. The polyimide film is fixed onto a metal frame and heated at 450° C. for 1 minute. The film is assumed to be non-thermoplastic when the heated film retains the original film shape, i.e., when the heated film undergoes no relaxing or melting.

The linear expansion coefficient of the non-thermoplastic polyimide film of the present invention is preferably 10 to 20 ppm. The moisture expansion coefficient of the film is preferably 13 ppm or less. The elasticity modulus of the film is preferably 5 to 10 GPa.

These physical properties usually change depending on the composition. In one aspect, it is possible to control the physical properties by changing the choice of the thermoplastic block component of the present invention.

In the present invention, from the standpoint of simplicity of the polymerization control and convenience of the facility, it is preferable to employ a polymerization process in which the non-thermoplastic polyimide precursor is prepared by adding a diamine and/or an acid dianhydride in adequately designed molar fractions after the synthesis of the thermoplastic polyimide precursor block component.

Any solvent that dissolves the polyimide precursor (hereinafter also referred to as "polyamic acid") may be used in the synthesis of the polyamic acid. Preferable examples include amide solvents such as N,N-dimethylformamide, N,N-dimethylacetamide, and N-methyl-2-pyrrolidone. N,N-Dimethylformamide and N,N-dimethylacetamide are particularly preferable.

A filler may be added to improve various properties of the film, such as slidability, thermal conductivity, electrical conductivity, corona resistance, and loop stiffness. The filler may be any but preferably silica, titanium oxide, alumina, silicon nitride, boron nitride, calcium hydrogen phosphate, calcium phosphate, or mica.

The diameter of the filler particles may be determined based on the film properties to be modified and the type of filler, and is thus not particularly limited. The average particle diameter is usually 0.05 to 100 μm, preferably 0.1 to 75 mm, more preferably 0.1 to 50 μm, and most preferably 0.1 to 25 μm. When the average diameter is below this range, the effect of modification is not readily exhibited. At an average diameter beyond this range, the surface quality and/or the mechanical properties may be significantly degraded. The amount of the filler to be added is determined based on the film properties to be modified and the diameter of the filler particles and is thus not particularly limited. The amount of the filler added is usually 0.01 to 100 parts by weight, preferably 0.01 to 90 parts by weight, and more preferably 0.02 to 80 parts by weight per 100 parts by weight of polyimide. At a filler content below this range, the effect of the modification by the use of the filler may not be sufficiently exhibited. At a filler content above this range, the mechanical properties of the film may be significantly degraded. The filler may be added by any method. The examples of the method include:

1) Method of adding the filler to the polymerization solution before or during the polymerization;
2) Method of adding and kneading the filler with a three-shaft roller after completion of the polymerization; and
3) Method of combining a polyamic acid organic solvent solution with a dispersion containing the filler prepared in advance.

It is preferable to employ the method of combining the polyamic acid solution with the filler-containing dispersion, in particular, a method of combining the polyamic acid solution with the dispersion immediately before the film forming since contamination of the manufacturing line by the filler is least. In preparing the filler-containing dispersion, the same solvent as the polymerization solvent for the polyamic acid is preferably used. In order to sufficiently disperse the filler and stabilize the dispersion state, a dispersant, a thickener, or the like may be used in amounts that do not adversely affect the properties of the film.

In a case where a filler is added to improve slidability of the film, a particle diameter of the filler is in the range from 0.1 to 10 μm, preferably 0.1 to 5 μm. When the particle diameter is below this range, the effect of improvement in slidability is rarely obtainable. When the particle diameter is above this range, it becomes difficult to form a fine wiring pattern. Furthermore, in this case, a dispersion state of the filler is also important, and the number of a filler aggregate of 20 μm or more per square meter is 50 or less, preferably 40 or less. When the number of the filler aggregate of 20 μm or more is above this range, a generated fine wiring pattern has a smaller adhesion area, which tends to decrease reliability of the FPC itself.

A known process may be employed to produce a polyimide film from the polyamic acid solution. In particular, a thermal imidization process and a chemical imidization process are available. Either process may be used to produce the film; however, the chemical imidization process tends to produce a polyimide film having various properties preferred in the present invention.

The process for producing a polyimide film particularly preferred in the present invention preferably includes the steps of:
a) reacting an aromatic diamine and an aromatic tetracarboxylic dianhydride in an organic solvent to yield a polyamic acid solution;
b) flow-casting a film-forming dope containing the polyamic acid solution onto a support;
c) heating the cast dope on the support and peeling off the resulting gel film from the support; and
d) further heating and drying the gel film to imidize the remaining amic acid.

In the steps described above, a curing agent including a dehydrator, e.g., an acid anhydride such as acetic anhydride; and an imidization catalyst, e.g., a tertiary amine such as isoquinoline, β-picoline, or pyridine, may be used.

A process for producing a polyimide film according to a preferred embodiment of the present invention, which is a chemical imidization process, will now be described as an example. It should be understood that the invention is not limited by the examples below.

The film-forming conditions and heating conditions vary depending on the type of polyamic acid, the thickness of the film, and the like.

A dehydrator and an imidization catalyst are mixed in a polyamic acid solution at low temperature to prepare a film-forming dope. The film-forming dope is then cast onto a support, such as a glass plate, an aluminum foil, an endless stainless steel belt, or a stainless steel drum, to prepare a film, and the film is heated at 80° C. to 200° C., preferably at 100° C. to 180° C. to activate the dehydrator and the imidization catalyst. The resulting film thereby partly cured and/or dried is then separated from the support to obtain a polyamic acid film (hereinafter referred to as "gel film").

The gel film is in the intermediate stage of curing the polyamic acid to a polyimide and has a self-supporting ability. The volatile component content in the gel film determined by the following equation (3) is 50 to 500 percent by weight:

$$(A-B) \times 100/B \qquad (3)$$

wherein A is the weight of the gel film, and B is the weight of the gel film after 20 minutes of heating at 450° C. The volatile component content is usually 5 to 500 percent by weight, preferably 5 to 200 percent by weight, and more preferably 5 to 150 percent by weight. A film satisfying this range is preferably used; otherwise, problems such as film breaking during the baking step, uneven color tone due to uneven drying, variations in characteristics, and the like may occur.

The amount of the dehydrator used is preferably 0.5 to 5 mol and more preferably 1.0 to 4 mol per mole of the amic acid unit in the polyamic acid.

The amount of the imidization catalyst is 0.05 to 3 mol and preferably 0.2 to 2 mol per mole of the amic acid unit in the polyamic acid.

When the content of the dehydrator and the imidization catalyst is below this range, chemical imidization proceeds insufficiently. Thus, breaking may occur during the baking, or mechanical strength may be reduced. When the content is beyond this range, the progress of imidization is excessively accelerated, and it may be difficult to satisfactorily cast the solution into a form of film.

A polyimide film of the present invention is obtained by fixing the ends of the gel film to dry the film without shrinkage during the curing and to thereby remove water, the residual solvent, the residual converting agent, and the catalyst. Then the residual amic acid is completely imidized to give a polyimide film of the present invention.

Here, it is preferable to finally heat the film at a temperature in a range of 400° C. to 650° C. for 5 to 400 seconds. If the temperature is over this range and/or if the heating time is beyond this range, heat deterioration of the film may occur. In contrast, if the temperature is below this range and/or if the heating time is below this range, expected effects may not be exhibited.

In order to reduce the internal stress remaining in the film, it is possible to heat the film under the lowest possible tension required for film transfer. The heating process may be conducted in the film-forming process; alternatively, a separate heating process may be provided. The heating conditions vary depending on the properties of the film or the device used. Although no general limitation can be introduced, the temperature of the heating process is usually in the range of 200° C. to 500° C., preferably 250° C. to 500° C., and most preferably 300° C. to 450° C. and the heating time is usually 1 to 300 seconds, preferably 2 to 250 seconds, and most preferably about 5 to 200 seconds, for reducing the internal stress.

The polyimide film produced as such is a non-thermoplastic polyimide film that contains a non-thermoplastic polyimide resin having a thermoplastic polyimide block component. The polyimide film produced as such is also a non-thermoplastic polyimide film comprising:

a non-thermoplastic polyimide resin having at least one residue unit derived from a compound having diamine functionality and at least one residue unit derived from a compound having acid dianhydride functionality, wherein either the residue unit derived from a compound having diamine functionality or the residue unit derived from a compound having acid dianhydride functionality has at least one amic acid group and exhibits a thermoplastic character when bound linearly using pyromellitic acid dianhydride (in the case of the compound having diamine functionality) or p-phenylenediamine (in the case of the compound having acid dianhydride functionality) and then imidized.

The polyimide film produced as such is also a non-thermoplastic polyimide film comprising:

a non-thermoplastic polyimide resin having at least one residue unit derived from a compound having diamine functionality and at least one residue unit derived from a compound having acid dianhydride functionality, wherein either the residue unit derived from a compound having diamine functionality or the residue unit derived from a compound having acid dianhydride functionality has at least one imide group and exhibits a thermoplastic character when bound linearly using pyromellitic acid dianhydride (in the case of the compound having diamine functionality) or p-phenylenediamine (in the case of the compound having acid dianhydride functionality) and then imidized.

This fact can be indirectly confirmed by comparing the physical properties according to the technique below. The technique for confirming the presence of a thermoplastic polyimide-derived block component in the produced non-thermoplastic polyimide film is as follows:

1) The monomer components of the non-thermoplastic polyimide film are analyzed with liquid chromatography by decomposing polyimide with an alkali such as hydrazine. When the film contains additives, such as a filler, the types and amounts of such additives are determined.
2) The following random polymerization is conducted for a designated composition:

i) The entire diamine is dissolved in DMF and the resulting solution is cooled in a 0° C. ice bath;

ii) To the resulting solution in the ice bath, powder of an acid dianhydride is gradually and carefully added under stirring so that no sedimentation occurs. A polyamic acid solution having a viscosity of 2,500 to 4,000 poise (23° C.) is obtained as a result. When two or more acid dianhydrides are used, the dianhydrides are mixed as powder and then added.

3) A film is produced by the following process:

i) In a 500 cc polyethylene container, 100 g of the polyamic acid solution is weighed and cooled to about 5° C. When a filler is to be used, the filler is preliminarily dispersed in the polyamic acid solution.

ii) To the polyamic acid solution resulting from i), 50 g of an imidization agent cooled to −10° C. and containing DMF and 0.8 mol of isoquinoline and 2 mol of acetic anhydride per mole of amic acid is added, and the resulting mixture is rapidly stirred.

iii) The solution resulting from ii) is degassed by centrifugation under cooling.

iv) The solution resulting from iii) is flow-cast onto an aluminum foil using a comma coater.

v) The cast solution and the aluminum foil carrying the cast solution are dried at 120° C. for 2 minutes, and the resulting gel film is peeled off from the aluminum foil and fixed onto a metal fixing frame. Here, caution must be paid not to shrink the gel film.

vi) The gel film fixed on the metal fixing frame is heated at 300° C. for 1 minute, at 400° C. for 1 minute, and at 450° C. for 1 minute in a preliminarily heated hot-air circulation oven, and is separated from the fixing frame to obtain a polyimide film having a thickness of 25 μm.

4) The comparison of the physical properties between the film thus obtained (hereinafter also referred to as the "comparative film") and the film prepared by the polymerization according to the present invention in which the thermoplastic polyimide block component is incorporated (hereinafter also referred to as the "inventive film") finds the following features:

i) The inventive film has an elasticity modulus higher than that of the comparative film by at least 0.3 GPa and in particular by at least 1 GPa.

ii) The inventive film has a linear expansion coefficient and moisture expansion coefficient smaller than those of the comparative film by at least 1 ppm and in particular by at least 3 ppm.

iii) Both films maintain substantially the same tensile elongation.

iv) The storage elasticity modulus of the inventive film at 380° C. determined by dynamic viscoelasticity analysis is lower than that of the comparative film by at least 0.1 GPa and in particular by at least 0.3 GPa. The tan δ peak value of the inventive film is larger than that of the comparative film by at least 0.01 and in particular by at least 0.02.

The following will describe the metal layer according to the present invention. The metal layer preferably includes a metal layer A produced by dry film formation. The metal layer A is formed on at least one surface of the polyimide film, and functions to tightly adhere to an electroless plated layer if the electroless plated layer is formed in the following process. Dry film formation (dry plating) is preferably adopted for producing the metal layer A because there is no need for applying plating catalyst onto the polyimide film to produce the metal layer A, and no plating catalyst therefore remains on the polyimide film.

Examples of a method for forming the metal layer A by dry plating include vacuum vapor deposition, sputtering, ion plating, and CVD (chemical vapor deposition).

Among the methods taken above, physical vapor deposition is preferable to form a metal layer since the physical vapor deposition exhibits excellent adherability. The physical vapor deposition includes vacuum vapor deposition and sputtering. Examples of the vacuum vapor deposition include resistance heating vapor deposition, EB deposition, cluster ion beam deposition, and ion plating deposition. Examples of the sputtering include RF sputtering, DC sputtering, magnetron sputtering, and ion beam sputtering. Any one or combination of these methods can be applied to the present invention.

Further, among these methods, sputtering methods are preferable from the standpoint of adhesive strength between the polyimide film and the metal layer A, simplicity of the facility, productivity, and cost. Among the sputtering methods, DC sputtering is particularly preferable. Also, ion plating deposition is industrially useful since it exhibits rapid film formation, and preferably employed since it exhibits excellent adherability.

Especially, the case where sputtering is adopted will be described in detail. A known method can be adopted as sputtering. That is, DC magnetron sputtering, RF sputtering, or these sputtering methods with various improvements can be adopted appropriate to the needs. For example, DC magnetron sputtering is preferable for an efficient sputtering of a conductor such as nickel and copper, whereas RF sputtering is preferable for sputtering under high vacuum for the purpose of preventing contamination of sputter gas in a thin film or the like purpose.

More specifically, DC magnetron sputtering is carried out as follows: First, the polyimide film is set in a vacuum chamber for vacuum suction (vacuuming). Generally, vacuum suction is performed by using a rotary pump for rough vacuuming in combination with a diffusion pump, a cryopump, or a turbo pump until the pressure inside the vacuum chamber reaches $6 \times 10^{-4}$ Pa or lower. Then, sputter gas is introduced into the chamber until the pressure inside the chamber reaches 0.1 to 10 Pa, preferably 0.1 to 1 Pa, and DC voltage is applied to a target metal so that plasma discharge occurs. In this case, the efficiency of sputtering for the deposition of plasma particles onto the target is enhanced by confining generated plasma in a magnetic field formed on the target. Under the situation where plasma is generated for several minutes to several hours, a surface oxidation layer is removed from the target metal (This process is called "pre-sputtering"). In this case, caution must be paid so that adverse effects caused by plasma or sputtering are not exerted on the polymer film. After the pre-sputtering is completed, the polyimide film is subjected to sputtering with a shutter opened or by the other operation. Discharge power at the sputtering is preferably in the range from 100 to 1000 watts. Batch sputtering or roll sputtering is adopted depending on the shape of a sample to be subjected to sputtering. The sputter gas to be introduced is generally inactive gas such as argon; however, a mixed gas containing small amount of oxygen or other gas can be employed.

The metal layer A is preferably made from a metal which has a high adhesive strength to the polyimide film and a circuit pattern formed on the metal layer A in the following circuit board producing process and allows clean removal in the etching process included in the method for producing a printed wiring board of the present invention. For example, the metal layer A can be made from metal such as Ni, Cu, Mo, Ta, Ti, V, Cr, Fe, Co, or alloy of any of these metals. Further, the metal layer A can be made up of a single layer or two or more layers made from any of these metals.

In an embodiment of the metal layer A of the present invention, a material for the metal layer A is preferably copper. Also, copper and at least one metal selected from the group consisting of Ni, Cu, Mo, Ta, Ti, V, Cr, Fe, Co can be employed as the material for the metal layer A. That is, the metal layer A may be (i) made from copper, (ii) made from alloy (complex) of copper and at least one metal selected from the above group, or (iii) made up of two layers in which one layer is made from at least one metal selected from the above group and the other layer is made from copper.

A thickness of the metal layer A, which may be determined as appropriate, is 1000 nm or less, preferably in the range from 2 to 1000 nm, more preferably in the range from 2 to 500 nm. A metal layer A having a thickness of less than 2 nm tends to exert an unstable peel strength.

In another embodiment of the metal layer A of the present invention, the metal layer A is of a two-layer structure having two types of metal layers, and thicknesses of the two layers are adjusted to appropriate thicknesses. A metal layer directly formed on the polyimide film is referred to as a metal layer A1, and a metal layer formed on the metal layer A1 is referred to as a metal layer A2. The structure with two types of metal layers allows for the improvement in etching properties, adherability to a polymer film, peel strength to an electroless plated film and an electroplated film, and the like property. That is, as the metal layer A1 directly formed on the polymer film, a metal that is effective to maintain excellent adherability to the polyimide film is selected. On the other hand, as the metal layer A2 formed on the metal layer A1, it is effective to select a metal that can be tightly adhered to an electroplated layer directly formed on the metal layer A2 or an electroless plated layer formed in a panel plating process.

A metal used for the metal layer A1 is preferably Ni, Cu, Mo, Ta, Ti, V, Cr, Fe, Co, and the like, and nickel is especially preferable. A thickness of the metal layer A1 is preferably in the range from 2 to 200 nm, more preferably in the range from 3 to 100 nm, especially preferably in the range from 3 to 30 nm. A thickness of less than 2 nm is not preferable since it cannot exert sufficient bonding strength, and makes it difficult to uniformly form the metal layer A1 on the polymer. On the other hand, a thickness of more than 200 nm requires extra etching in the etching process during the production of a printed wiring board, and may therefore result in a circuit thinner than designed, a circuit with a smaller width, the occurrence of undercut or the like phenomenon, a circuit in degraded form. In addition, peeling of the film, curling of the film, or the like problem occurs due to difference in dimensional change between the metal layer A1 and the metal layer A2.

Meanwhile, a metal used for the metal layer A2 may be determined according to the type of plating directly formed on the metal layer A2 in the process of producing a printed wiring board, i.e. whether an electro plating or an electroless plating. Considering that the electroless plating is preferably an electroless copper plating and an electroless nickel plating, especially preferably an electroless copper plating as will be described later, a metal used for the metal layer A2 is preferably copper and nickel, especially preferably copper. A thickness of the metal layer A2 is suitably in the range from 10 to 300 nm, more suitably in the range from 20 to 200 nm, preferably in the range from 50 to 150 nm. A thickness of less than 10 nm makes it difficult to maintain sufficient adherability to an electroless plated layer in the following process. On the other hand, a thickness of more than 200 nm is not needed. A thickness of the metal layer A2 is desirably 200 nm or less in consideration of the following etching process.

A thickness of the metal layer A obtained when the metal layer A1 is combined with the metal layer A2 is preferably in the range from 20 to 400 nm, more preferably 50 to 200 nm.

It is preferable that dry plating is continuously performed in vacuum. In this case, dry plating is preferably vapor deposition and sputtering, more preferably sputtering, especially preferably DC sputtering.

In a case where dry plating is adopted in the process in which the metal layer is directly formed on the polyimide film without using an adhesive, vacuum suction is performed in the course of dry plating. Therefore, it is desirable that a state within the system is changed to a nearly vacuum state as soon as possible in consideration of productivity.

As noted above, the non-thermoplastic polyimide film used in the metal-coated polyimide film of the present invention has a high water vapor transmission rate. It has surprisingly been found that polyimide films having the indicated high water vapor transmission rate are rapidly conditioned under vacuum to be ready for formation of a metal layer directly and without use of an adhesive. As a result of this, the method using a non-thermoplastic polyimide film is advantageous in that it allows the production of the metal-coated polyimide product at a higher speed and in very high quality when the metal layer is formed thereon by dry plating such as sputtering.

The non-thermoplastic polyimide film used in the present invention is preferably used in directly forming a metal layer thereon due to its high water vapor transmission rate and its quick conditioning in the vacuum chamber.

The water vapor transmission rate varies depending on the thickness of the film. For this reason, a value represented by following equation (3) is used as a property of the water vapor transmission.

$$\text{Water Vapor Transmission Rate Value} = \text{water vapor transmission rate} \times \text{thickness} \quad (3)$$

No commercially available film having the value represented from the equation (3) of at least about 2500 $\mu m \cdot g/m^2/24$ h has been found. Preferably, the Water Vapor Transmission Rate Value is at least about 3000 $\mu m \cdot g/m^2/24$ h.

This value was derived from the fact that the water vapor transmission rate is inversely proportional to the thickness of the film as shown in the graph of FIG. 1. In the graph of FIG. 1, the inclination of each line (3503.2, 1723.1, 594.58, and 153.5; horizontal axis: 1/(thickness)) indicates a value of "water vapor transmission rate×thickness."

Industrial Applicability

The metal-coated polyimide film of the present invention exhibits excellent adherability although it has a metal layer directly formed thereon without using an adhesive. The metal-coated polyimide film of the present invention can be therefore suitably used for a flexible printed wiring board, TAB tape, and other materials.

EXAMPLES

The present invention will now be described in specifics by way of examples. It is to be understood that the present invention is not limited to these examples.

(Dynamic Viscoelasticity Measurement)

Storage modulus was measured with DMS-600 produced by Seiko Instruments Inc. under the following conditions. As a result of the measurement, storage modulus at 380° C. and tan δ peak value were obtained.

Temperature profile: 0 to 400° C. (3° C./min)
Sample size: 9 mm in width, distance between holding tools: 20 mm
Frequency: 5 Hz
Strain amplitude: 10 μm
Minimum tension: 100
Tension gain: 1.5
Initial value of force amplitude: 100 mN (Initial Metal Foil Peel-Strength)

In accordance with Japanese Industrial Standard C-6471, a 1-mm metal pattern was evaluated in 90-degree peel strength test.

(Metal Foil Peel-Strength: Bonding Strength After PCT (Pressure Cooker Test))

A sample prepared as in the measurement of the initial bonding strength was introduced into a pressure cooker tester PC-422RIII (Product name) produced by Hirayama Manufacturing Corporation, and left for 96 hours at 121° C. and 100% R.H. Then, bonding strength of the sample taken out of the tester was measured as in the measurement of the initial bonding strength.

(Identification of Thermoplasticity)

A polyimide film containing a thermoplastic polyimide block component was prepared at a maximum baking temperature of 300° C. for a baking time of 15 minutes. The film was fixed on a metal fixing frame and heated at 450° C. for 1 minute. The film was assumed to be thermoplastic when the film softened and did not retain its original shape.

(Moisture Expansion Coefficient)

The length ($L1$) of a film was measured at 50° C. and 30% R.H., the humidity was then increased to 80% R.H., and the length ($L2$) of the film at 50° C. and 80% R.H. was measured. The moisture expansion coefficient was determined by the following equation:

$$\text{Moisture Expansion Coefficient (ppm)} = (L2-L1)/L1/(80-30) \times 10^6$$

(Linear Expansion Coefficient)

The linear expansion coefficient of the polyimide film obtained was measured by using Thermo-mechanical Analysis Instrument TMA/SS6100 manufactured by SII Nanotechnology Inc. To measure the linear expansion coefficient, the polyimide film was heated from 0 to 460° C., and then cooled down to 10° C. After that, the polyimide film was heated at the heating rate of 10° C./min. The polyimide film was measured at 100° C. and 200° C. in the second heating. The measurement values were averaged to work out the linear expansion coefficient of the polyimide film.

Sample size: 3 mm in width, 10 mm in length
Load: 29.4 mN
Temperature range in measurement: 0 to 460° C.
Heating rate: 10° C./min (Elasticity Modulus and Elongation)

The elasticity modulus was measured according to the standard D882 of American Society of Testing and Materials (ASTM).

(Measurement of Water Vapor Transmission Rate)

In accordance with the Japanese Industrial Standard Z0208, measurement was conducted at a temperature of 40° C. and at 90% relative humidity.

Example 1

In 546 g of N,N-dimethylformamide (DMF) cooled to 10° C., 46.43 g of 2,2-bis(4-aminophenoxyphenyl)propane (BAPP) was dissolved. To this solution, 9.12 g of 3,3',4,4'-benzophenonetetracarboxylic dianhydride (BTDA) was added and dissolved. Then, 16.06 g of pyromellitic dianhydride (PMDA) was added and the resulting mixture was stirred for 30 minutes to obtain a thermoplastic polyimide precursor block component.

In this solution, 18.37 g of p-phenylenediamine (p-PDA) was dissolved, and then 37.67 g of PMDA was added to the resulting solution and dissolved by stirring for 1 hour. A separately prepared DMF solution of PMDA (PMDA 1.85 g/DMF 24.6 g) was carefully added to the resulting solution, and the addition was ceased when the viscosity reached about 3,000 poise. Stirring was continued for 1 hour to obtain a polyamic acid solution having a solid content of about 19 wt % and a rotational viscosity at 23° C. of 3,400 poise.

To 100 g of this polyamic acid solution, 50 g of a curing agent composed of acetic anhydride/isoquinoline/DMF (ratio of 18.90/7.17/18.93 based on weight) was added, and the resulting mixture was stirred and degassed at a temperature of 0° C. or lower. The mixture was then flow-cast on an aluminum foil using a comma coater. This resin film was heated at 130° C. for 150 seconds. The resulting self-supporting gel film (residual volatile component content: 45 wt %) was peeled from the aluminum foil, fixed on a metal frame, and dried at 300° C. for 20 seconds, 450° C. for 20 seconds, and 500° C. for 20 seconds for imidization to obtain a polyimide film having a thickness of 38 μm. The obtained polyimide film was fixed on a metal fixing frame, and heating the fixed film at 450° C. was attempted. However, the film did not change its appearance. It was confirmed that the film was non-thermoplastic.

The surface of the polyimide film was subjected to ion gun processing at 200 V, 10 mA for 60 seconds. Thereafter, by using a sputtering apparatus (produced by Showa Shinku Co., Ltd), 50 angstrom of nickel was laminated on the surface of the polyimide film. Further, 2000 angstrom of copper was laminated on the nickel lamination layer. Still further, the copper lamination layer was treated by sulfate electric copper plating (cathode current density: 2 A/dm2, plating thickness: 20 μm, 20 to 25° C.) was to prepare a metal-coated polyimide film.

The properties of the obtained metal-coated polyimide film are shown in Table 1. In Table 1, polymerization recipe is shown in molar ratio.

A film was prepared by using a polyamic acid solution with BAPP/BTDA/PMDA=46.43 g/9.12 g/18.53 g. As a result of the thermoplasticity determination of the thermoplastic block component, it was confirmed that the thermoplastic block component has thermoplasticity.

Examples 2 through 4

A metal-coated polyimide film was prepared as in EXAMPLE 1 but with a different monomer ratio. The properties of the films obtained are shown in Tables 1 and 2.

In EXAMPLES 2 and 3, the confirmation of the thermoplastic block component was conducted as in EXAMPLE 1, and it was confirmed that the thermoplastic block component has thermoplasticity.

Comparative Example 1—Film With No Thermoplastic Block Component

In 546 g of N,N-dimethylformamide (DMF) cooled to 10° C., 18.37 g of p-phenylenediamine (p-PDA) was dissolved. To this solution, 33.56 g of pyromellitic dianhydride (PMDA) was added and the resulting mixture was stirred for 30 minutes to obtain a block component.

In this solution, 46.43 g of 2,2-bis(4-aminophenoxyphenyl)propane (BAPP) was dissolved, and then 9.12 g of 3,3',4,4'-benzophenonetetracarboxylic dianhydride (BTDA) was added to the resulting solution. Thereafter, 22.24 g of PMDA was added to the solution and dissolved by stirring for 1 hour. A separately prepared DMF solution of PMDA (PMDA 1.85 g/DMF 24.6 g) was carefully added to the resulting solution, and the addition was ceased when the viscosity reached about 3,000 poise. Stirring was continued for 1 hour to obtain a polyamic acid solution having a solid content of about 19 wt % and a rotational viscosity at 23° C. of 3,400 poise. By using the obtained polyimide acid solution, a metal-coated polyimide film was obtained as in EXAMPLE 1. The properties of the metal-coated polyimide film are shown in Table 2. Plasticity determination of the block component was conducted as in EXAMPLE 1, and it was confirmed that the block component was non-thermoplastic.

Comparative Example 2—Film With No Thermoplastic Block Component

In 546 g of N,N-dimethylformamide (DMF) cooled to 10° C., 18.37 g of p-phenylenediamine (p-PDA) and 46.43 g of 2,2-bis(4-aminophenoxyphenyl)propane (BAPP) were dissolved. To this solution, 9.12 g of 3,3',4,4'-benzophenonetetracarboxylic dianhydride (BTDA) and 53.73 g of pyromellitic dianhydride (PMDA) were added and the resulting mixture was dissolved by stirring for 1 hour. A separately prepared DMF solution of PMDA (PMDA 1.85 g/DMF 24.6 g) was carefully added to the resulting solution, and the addition was ceased when the viscosity reached about 3,000 poise. Stirring was continued for 1 hour to obtain a polyamic acid solution having a solid content of about 19 wt % and a rotational viscosity at 23° C. of 3,000 poise. By using the obtained polyimide acid solution, a metal-coated polyimide film was obtained as in EXAMPLE 1. The properties of the metal-coated polyimide film are shown in Table 2.

Comparative Example 3

As a result of the measurement of water vapor transmission rate of 38 mm of Apical HP (produced by Kaneka Corporation) was measured, and it was 5 g/m$^2$/24 h.

Reference Example 1—Film With No Thermoplastic Block Component

In 546 g of N,N-dimethylformamide (DMF) cooled to 10° C., 46.43 g of 2,2-bis(4-aminophenoxyphenyl)propane (BAPP) and 18.37 g of p-phenylenediamine (p-PDA) were dissolved. To this solution, 9.12 g of 3,3',4,4'-benzophenonetetracarboxylic dianhydride (BTDA) and 53.73 g of pyromellitic dianhydride (PMDA) were added and dissolved by stirring for 1 hour. A separately prepared DMF solution of PMDA (PMDA 1.85 g/DMF 24.6 g) was carefully added to the resulting solution, and the addition was ceased when the viscosity reached about 3,000 poise. Stirring was continued for 1 hour to obtain a polyamic acid solution having a solid content of about 19 wt % and a rotational viscosity at 23° C. of 3,400 poise.

To 100 g of this polyamic acid solution, 50 g of a curing agent composed of acetic anhydride/isoquinoline/DMF (ratio of 16.96/8.58/24.46 based on weight) was added, and the resulting mixture was stirred and degassed at a temperature of 0° C. or lower. The mixture was then flow-cast on an aluminum foil using a comma coater. This resin film was heated at 120° C. for 2 minutes. The resulting gel film was peeled from the aluminum foil and fixed on a metal frame with care to prevent shrinkage of the gel film. The gel film fixed on the metal frame was heated at 300° C. for 1 minute, 400° C. for 1 minute, and 450° C. for 1 minute in a preheated circulating hot air oven. Then, the gel film was removed from the frame to obtain a polyimide film having a thickness of 38 μm. By using the obtained polyimide film, a metal-coated polyimide film was obtained as in EXAMPLE 1. The properties of the metal-coated polyimide film are shown in Table 2.

TABLE 1

| POLYMERIZATION RECIPE | EXAMPLE 1 | | EXAMPLE 2 | | EXAMPLE 3 | | EXAMPLE 4 | |
|---|---|---|---|---|---|---|---|---|
| | BAPP | 40 | BAPP | 50 | BAPP | 40 | ODA | 20 |
| | BTDA | 10 | BTDA | 40 | BTDA | 10 | BAPP | 30 |
| | PMDA | 26 | PDA | 50 | PMDA | 22 | BTDA | 20 |
| | PDA | 60 | PMDA | 60 | PDA | 60 | PMDA | 25 |
| | PMDA | 64 | | | PMDA | 68 | PDA | 50 |
| | | | | | | | PMDA | 55 |
| NO. OF REPEATING UNITS OF BLOCK COMPONENT | 9 | | 4 | | 4 | | 9 | |
| CONTENT OF THERMOPLASTIC BLOCK COMPONENT | 40 | | 50 | | 40 | | 50 | |
| WATER VAPOR TRANSMISSION RATE | 170 g/m$^2$/24 h | | 190 g/m$^2$/24 h | | 160 g/m$^2$/24 h | | 130 g/m$^2$/24 h | |
| ELASTICITY MODULUS (GPa) | 7.3 | | 6.1 | | 6.5 | | 6.8 | |
| ELONGATION (%) | 45 | | 60 | | 48 | | 55 | |
| LINEAR EXPANSION COEFFICIENT | 11 | | 22 | | 14 | | 11 | |
| MOISTURE EXPANSION COEFFICIENT | 9 | | 11 | | 10 | | 10 | |
| TAN δ PEAK VALUE | 0.10 | | 0.13 | | 0.08 | | 0.15 | |
| STORAGE MODULUS AT 380° C. | 1.1 | | 0.9 | | 1.2 | | 0.8 | |
| BONDING STRENGTH (N/cm) INITIAL VALUE | 8.5 | | 7.3 | | 8.6 | | 8.0 | |
| VALUE AFTER PCT | 4.3 | | 4.0 | | 4.6 | | 4.5 | |

In Example 1, the thermoplastic block component was composed of three components in the polymerization recipe, BAPP/BTDA/PMDA (monomer ratio=40/10/26) in Table 1.

In Example 2, the thermoplastic block component was composed of the two components in the polymerization recipe, BAPP/BTDA (monomer ratio=50/40) in Table 1.

In Example 3, the thermoplastic block component was composed of the three components in the polymerization recipe, BAPP/BTDA/PMDA (monomer ratio=40/10/22) in Table 1.

In Example 4, the thermoplastic block component was composed of the four components in the polymerization recipe, ODA/BAPP/BTDA/PMDA (monomer ratio=20/30/20/25) in Table 1.

TABLE 2

|  | COMPARATIVE EXAMPLE 1 | | COMPARATIVE EXAMPLE 2 | | REFERENCE EXAMPLE 1 | |
|---|---|---|---|---|---|---|
| POLYMERIZATION RECIPE | PDA | 60 | PDA | 60 | BAPP | 40 |
|  | PMDA | 54 | BAPP | 40 | PDA | 60 |
|  | BAPP | 40 | BTDA | 10 | BTDA | 10 |
|  | BTDA | 10 | PMDA | 90 | PMDA | 90 |
|  | PMDA | 36 |  |  |  |  |
| NO. OF REPEATING UNITS OF BLOCK COMPONENT | — | | — | | — | |
| CONTENT OF THERMOPLASTIC BLOCK COMPONENT | — | | — | | — | |
| WATER VAPOR TRANSMISSION RATE | 100 g/m$^2$/24 h | | 100 g/m$^2$/24 h | | 110 g/m$^2$/24 h | |
| ELASTICITY MODULUS (GPa) | 7.1 | | 6.2 | | 6.0 | |
| ELONGATION (%) | 15 | | 45 | | 50 | |
| LINEAR EXPANSION COEFFICIENT | 10 | | 17 | | 15 | |
| MOISTURE EXPANSION COEFFICIENT | 9 | | 14 | | 13 | |
| TAN δ PEAK VALUE | 0.10 | | 0.07 | | 0.07 | |
| STORAGE MODULUS AT 380° C. | 1.1 | | 1.4 | | 1.8 | |
| BONDING STRENGTH (N/cm) INITIAL VALUE | 4.0 | | 4.2 | | 5.1 | |
| VALUE AFTER PCT | 2.5 | | 2.0 | | 1.5 | |

Example 5

A polyimide film having a thickness of 10 μm was prepared as in EXAMPLE 4 except that the resin film on the aluminum foil was heated at 110° C. for 70 sec and the self-supporting gel film fixed on a metal frame was dried at 300° C. for 20 seconds, and 450° C. for 40 seconds for imidization as shown in Table 3. The Water Vapor Transmission Rate of the film obtained is shown in Table 3. A comparison with the commercially available films, A (Apical NPI (produced by Kaneka Corporation), B (Apical HP (produced by Kaneka Corporation), C is shown in the graph of FIG. 1.

Example 6

A polyimide film having a thickness of 12.5 μm was prepared as in EXAMPLE 4 except that the resin film on the aluminum foil was heated at 120° C. for 70 sec and the self-supporting gel film fixed on a metal frame was dried at 300° C. for 20 seconds, and 450° C. for 40 seconds for imidization as shown in Table 3. The Water Vapor Transmission Rate of the film obtained is shown in Table 3. A comparison with the commercially available films, A (Apical NPI (produced by Kaneka Corporation), B (Apical HP (produced by Kaneka Corporation), C is shown in the graph of FIG. 1.

Example 7

A polyimide film having a thickness of 17 μm was prepared as in EXAMPLE 4 except that the resin film on the aluminum foil was heated at 135° C. for 70 sec and the self-supporting gel film fixed on a metal frame was dried at 300° C. for 20 seconds, 450° C. for 20 seconds, and 460° C. for 20 seconds for imidization as shown in table 3. The Water Vapor Transmission Rate of the film obtained is shown in Table 3. A comparison with the commercially available films, A (Apical NPI (produced by Kaneka Corporation), B (Apical HP (produced by Kaneka Corporation), C is shown in the graph of FIG. 1.

Example 8

A polyimide film having a thickness of 25 μm was prepared as in EXAMPLE 4 except that the resin film on the aluminum foil was heated at 130° C. for 130 sec and the self-supporting gel film fixed on a metal frame was dried at 300° C. for 20 seconds, 450° C. for 20 seconds, and 480° C. for 20 seconds for imidization as shown in Table 3. The Water Vapor Transmission Rate of the film obtained is shown in Table 3. A comparison with the commercially available films, A (Apical NPI (produced by Kaneka Corporation), B (Apical HP (produced by Kaneka Corporation), C is shown in the graph of FIG. 1.

TABLE 3

|  | Example 5 | Example 6 | Example 7 | Example 8 |
|---|---|---|---|---|
| thickness of the film (μm) | 10 | 12.5 | 17 | 25 |
| The Water Vapor Transmission Rate of the film (g/m2/24 h) | 340 | 270 | 210 | 150 |

The invention claimed is:

1. A metal-coated polyimide film comprising: a non-thermoplastic polyimide film; and a metal layer being directly formed on one surface or both surfaces of the non-thermoplastic polyimide film without using an adhesive, wherein the non-thermoplastic polyimide film contains a non-thermoplastic polyimide resin having a thermoplastic polyimide block component, and the non-thermoplastic polyimide film, when fixed onto a metal frame and heated for 450° C. for one minute, retains its original film shape.

2. The metal-coated polyimide film according to claim 1, wherein the thermoplastic block component is present in an amount of 20 to 60 mol % of the entire non-thermoplastic polyimide resin.

3. The metal-coated polyimide film according to claim 1, wherein the diamine component in the thermoplastic polyimide block component contains 2,2-bis(4-aminophenoxyphenyl) propane.

4. The metal-coated polyimide film according to claim 1, wherein the acid component in the thermoplastic polyimide block component contains a benzophenonetetracarboxylic acid and/or a biphenyltetracarboxylic acid.

5. The metal-coated polyimide film according to claim 1, wherein the number n of repeating units of the thermoplastic polyimide block component is 3 to 99.

6. The metal-coated polyimide film according to claim 5, wherein the number n of repeating units of the thermoplastic polyimide block component is 4 to 90.

7. The metal-coated polyimide film according to claim 1, wherein the non-thermoplastic polyimide film is a polyimide film consisting of a non-thermoplastic polyimide resin having a thermoplastic polyimide block component.

8. The metal-coated polyimide film according to claim 1, wherein the non-thermoplastic polyimide film further contains a filler and a non-thermoplastic polyimide resin having a thermoplastic polyimide block component.

9. The metal-coated polyimide film according to claim 8, wherein the non-thermoplastic polyimide resin having the thermoplastic polyimide block component is 50 wt % or more of the film.

10. The metal-coated polyimide film according to claim 1, wherein the metal layer has a metal layer A formed by a dry film forming method.

11. The metal-coated polyimide film according to claim 10, wherein the metal layer A has: a metal layer A1 that contacts the non-thermoplastic polyimide film; and a metal layer A2 formed on the metal layer A1.

12. The metal-coated polyimide film according to claim 11, wherein the metal layer A1 contains at least one metal selected from the group consisting of Ni, Cu, Mo, Ta, Ti, V, Cr, Fe, and Co.

13. The metal-coated polyimide film according to claim 10, wherein the dry film forming method is any method selected from sputtering, ion plating, and vapor deposition.

14. The metal-coated polyimide film according to claim 10, wherein a metal layer is formed on the metal layer A by electroless plating or electroplating.

15. The metal-coated polyimide film according to claim 10, further comprising: (i) a metal layer being formed on the metal layer A by electroless plating; and (ii) a metal layer being formed on the metal layer (i) by electroplating.

16. A flexible printed wiring board including a metal-coated polyimide film according to claim 10.

17. A metal-coated polyimide film comprising: a base metal layer being formed on one surface or both surfaces of a non-thermoplastic polyimide film containing non-thermoplastic polyimide resin having thermoplastic polyimide block component by a dry film forming method; and a conductive layer being formed on the metal layer by at least one of sputtering, electroplating, and electroless plating, wherein the non-thermoplastic polyimide film, when fixed onto a metal frame and heated from 450° C. for one minute, retains its original film shape.

18. A method of preparing a metal-coated polyimide film comprising:
 a) providing a non-thermoplastic polyimide film containing a non-thermoplastic polyimide resin having a thermoplastic polyimide block component;
 b) applying vacuum suction to the polyimide film; and
 c) forming a metal layer directly on the polyimide film by a dry film forming method without using an adhesive, wherein the non-thermoplastic polyimide film, when fixed onto a metal frame and heated from 450° C. for one minute, retains its original film shape.

19. The method of claim 18, wherein the dry film forming method is a method selected from sputtering, ion plating, and vapor deposition.

* * * * *